(12) United States Patent
Ihara

(10) Patent No.: US 6,444,620 B2
(45) Date of Patent: Sep. 3, 2002

(54) HIGH TEMPERATURE SUPERCONDUCTOR HAVING LOW SUPERCONDUCTING ANISOTROPY AND METHOD FOR PRODUCING THE SUPERCONDUCTOR

(75) Inventor: Hideo Ihara, Tsukuba (JP)

(73) Assignee: Agency of Industrial Science & Technology, Ministry of International Trade & Industry, Tokyo (JP)

( * ) Notice: Subject to any disclaimer, the term of this patent is extended or adjusted under 35 U.S.C. 154(b) by 0 days.

(21) Appl. No.: 09/032,067

(22) Filed: Feb. 27, 1998

(30) Foreign Application Priority Data

Feb. 28, 1997 (JP) ............................................. 9-044521

(51) Int. Cl.$^7$ ......................... H01B 12/00; H01L 39/12; C04B 101/00
(52) U.S. Cl. ..................... 505/125; 505/120; 505/121; 505/501
(58) Field of Search ................................. 505/100, 120, 505/121, 125, 775, 776, 777, 782, 783, 470, 500, 501

(56) References Cited

U.S. PATENT DOCUMENTS

5,919,735 A * 7/1999 Ihara et al. .................. 505/125

FOREIGN PATENT DOCUMENTS

JP        8-183614        7/1996

OTHER PUBLICATIONS

Ihara et al. "Origin of least superconducting anisotropy of CyB9$_2$ Ca$_3$ CuyO$_{12-y}$ . . . " Adv. Supercond VIII, Proc. Int. Symp. Supercond. (Abstract) 1996.*

H. Ihara, et al., "Cu$_{1-x}$TL$_x$Ba$_2$Ca$_3$Cu$_4$O$_{12-y}$ (Cu$_{1-x}$Tl$_{x-}$1234) Superconductor with Tc=126 K," Proceedings of the International Conference on Materials and Mechanisms of Superconductivity High Temperature Superconductors 1997, Physica C Superconductivity, (To be Published).

Hideo Ihara, et al., "New High–Tc Superconductor Families of Ag$_{1-x}$Cu$_x$Ba$_2$Ca$_{n-1}$Cu$_n$O$_{2n+3-y}$ and CuBa$_2$Ca$_{n-1}$Cu$_n$O$_{2n+4-y}$ With Tc>116 K," Proceedings of the International Conference on Materials and Mechanisms of Superconductivity High Temperature Superconductors IV, Physica C Superconductivity, vols. 235–240, (Dec. 1994), Part II, pp. 981–982.

Hideo Ihara, et al., "New High–Tc Superconductor Ag$_{1-x}$Cu$_x$Ba$_2$Ca$_{n-1}$Cu$_n$O$_{2n+3-\delta}$ Family With Tc22 117 K," Jpn. J. Appl. Phys., vol. 33. Pt. 2, No. 3A, (Mar. 1994), pp. L300–L303.

H. Ihara, "Beyond A Half Way to Room Temperature Superconductors–ABa$_2$Ca$_{n-1}$Cu$_n$O$_{2n+3-y}$ (A=Tl, Hg, Ag,—)–," Bulletin Of The Electrotechnical Laboratory, vol.58, No. 6, (1994), pp. 64–68.

* cited by examiner

Primary Examiner—Mark Kopec
(74) Attorney, Agent, or Firm—Oblon, Spivak, McClelland, Maier & Neustadt, P.C.

(57) ABSTRACT

A high-temperature superconductor having low superconducting anisotropy includes a two-dimensional layered structure of crystal unit cells each consisting of a pair of superconducting layer and charge reservoir layer. At least a portion of the atoms of the charge reservoir layer are replaced by atoms giving superconductivity, rendering the charge reservoir layer superconducting and lowering the superconducting anisotropy by increasing the coherence length in the thickness direction.

4 Claims, 7 Drawing Sheets

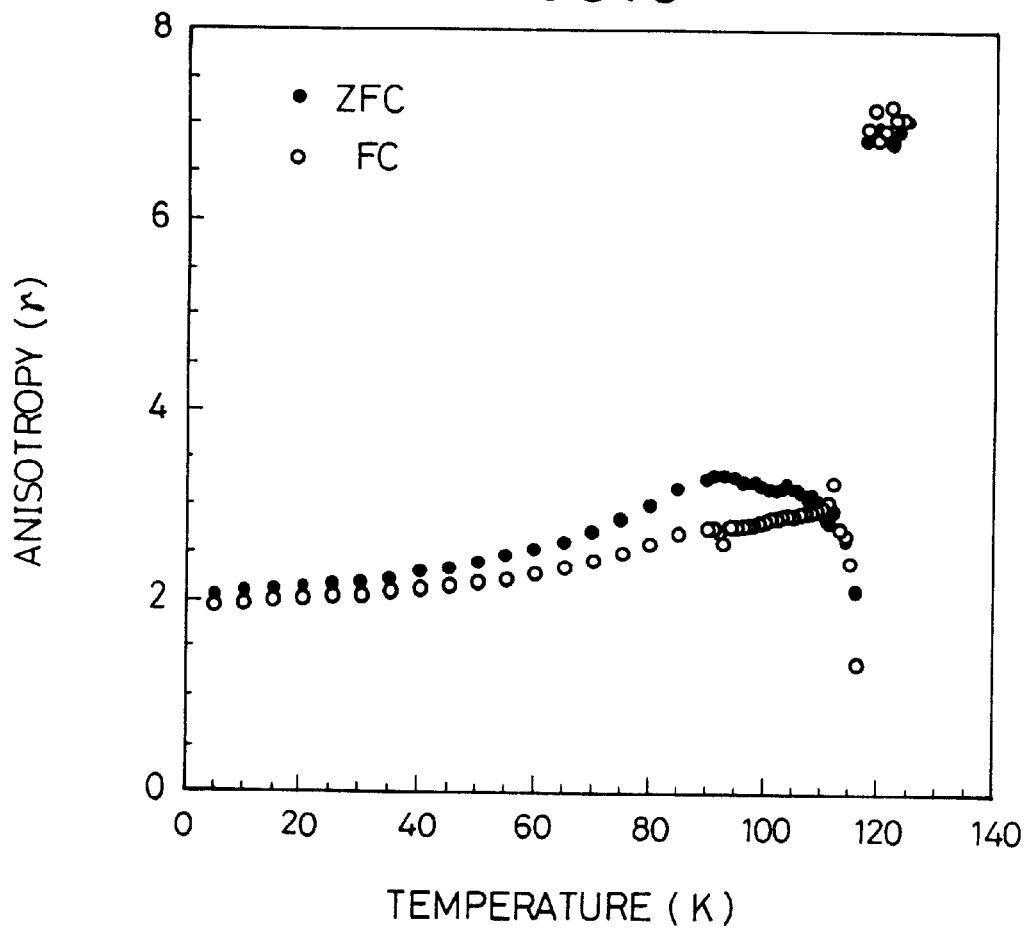

HIGH TEMPERATURE SUPERCONDUCTOR HAVING LOW SUPERCONDUCTING ANISOTROPY AND METHOD FOR PRODUCING THE SUPERCONDUCTOR

BACKGROUND OF THE INVENTION

1. Field of the Invention

The present invention relates to a high temperature superconductor that has low superconducting anisotropy, a high critical current density (Jc), a high irreversible field (Hirr) and a long coherence length $\xi c$ in a direction perpendicular to the plane (the direction being the c-axis direction, the intrafacial plane the ab-axis), and a superconducting transition temperature (Tc) of, for example, 100 K or more, and to a method for producing the superconductor.

2. Description of the Prior Art

A high Tc has been considered to be closely related to high superconducting anisotropy (two-dimensionality) of superconducting properties. Known high-temperature superconductors having a two-dimensional layered structure comprised of charge reservoir layers and superconducting layers include Y, Bi, Tl, and Hg based copper oxide superconductors.

Moreover, because in these superconductors having a layered structure the charge reservoir layer is an insulation layer or non-superconducting layer with low superconductive coupling in the c-axis direction and, therefore, a small interactive effect between superconducting layers, in addition to which the coherence length along the c-axis is short, superconducting anisotropy γ is large, being in the order of 4–5 to 300 (γ defined as the ratio of the coherence length, the square root of the electron effective mass ratio, or magnetic field penetration depth ratio, is $\gamma = \xi ab/\xi c = (m_c/m_{ab})^{1/2} = \lambda c/\lambda ab$).

As such, the Jc, especially the Jc under a high magnetic field, and the Hirr, the upper limit magnetic field at that electrical resistance generates, become small, posing many problems to the practical use as wire or bulk superconducting material.

Furthermore, the large superconducting anisotropy means that the coherence length $\xi c$ in the c-axis direction is small, so that when used as a superconducting device material, the properties of the layered-structure-typed superconducting device are not adequate, especially the Josephson current density. In JP-A-Hei 8-183614, the inventors including the present inventor proposed a high-temperature superconductor having low superconducting anisotropy, a long coherence length in the c-axis direction and a large current density under a high magnetic field, using a matrix of copper, oxygen and alkaline earth metal elements instead of Tl, Hg and other such elements that are harmful and scarce.

There are reports claiming low superconducting anisotropy with respect to Hg-based Hg-1201 (HgBa$_2$CuO$_{4+y}$) and infinite layer structure superconductors (Sr$_{1-x}$La$_x$CuO$_2$), but based on research by the present inventor, such superconductors are not a low anisotropic superconductor.

An object of the present invention is to provide a high-temperature superconductor that is low in superconducting anisotropy, with superconducting electrons being able to move not only in the plane of the layers (ab-axis direction) but also perpendicular thereto, and exhibits a practicably large critical current density under high temperature and high magnetic field conditions, and a method for producing the superconductor.

Another object of the present invention is to provide a high-temperature superconductor that is low in superconducting anisotropy and excellent in magnetic properties which provides strong coupling between the superconducting layers mediated by the charge reservoir layer, high magnetic-flux pinning capability and high zero resistance-magnetic field, and a method for producing the superconductor.

Still another object of the present invention is to provide a low superconducting anisotropy, high-temperature superconductor having a long coherence length in the c-axis direction, and a method for producing the superconductor.

SUMMARY OF THE INVENTION

In accordance with the present invention, the above object is attained by providing a high-temperature superconductor having low superconducting anisotropy, comprising a two-dimensional layered structure of lattice unit cells each constituted by a pair of superconducting layer and charge reservoir layer provided perpendicularly on the superconducting layer, wherein at least a portion of atoms comprising the charge reservoir layer are replaced by atoms giving superconductivity, metallizing or rendering the charge reservoir layer superconducting, a thickness of the superconducting layer is increased, and therefore coherence length in a thickness direction is increased based on the uncertainty principle, lowering superconducting anisotropy.

Copper and oxygen are examples of atoms giving superconductivity. The low superconducting anisotropy, high-temperature superconductor may be produced by a method comprising supplying the superconductor starting material onto a single-crystal substrate or crystal-oriented substrate, sealing the substrate in an oxidation resistant capsule and applying a prescribed pressure and heat to the capsule.

Thus, as described in the foregoing, by increasing the superconducting layer thickness of the superconductor according to this invention, the superconducting electron uncertainty region (thickness) in the perpendicular direction (c-axis direction) is expanded according to the uncertainty principle, making it possible to increase the coherence length in the direction of the c-axis, thereby enabling the superconducting anisotropy to be reduced to a very low level.

Moreover, by replacing some or all of the atoms constituting the charge reservoir layer existing alternately with the superconducting layer with atoms giving superconductivity, thereby metallizing or rendering the charge reservoir layers superconducting, strengthening the superconducting coupling and allowing free movement of the superconducting electrons.

The above and other features of the present invention will become apparent from the following description made with reference to the drawings.

BRIEF EXPLANATION OF THE DRAWINGS

FIG. 8 shows the relationship between temperature and superconducting anisotropy obtained from the magnetic susceptibility ratio of a Cu-1245 sample with a c-axis orientation.

DESCRIPTION OF THE PREFERRED EMBODIMENT

Figure 1:
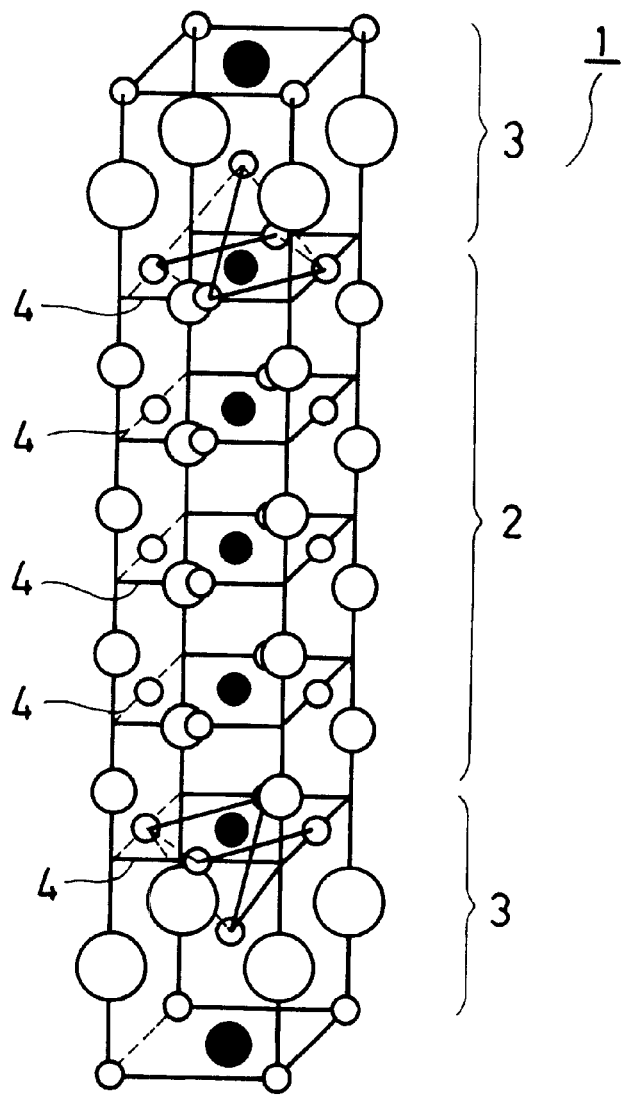
FIG. 1 is a diagram showing an example of a model of a crystal unit cell of a high temperature superconductor having low superconducting anisotropy according to this invention.
Figure 1:
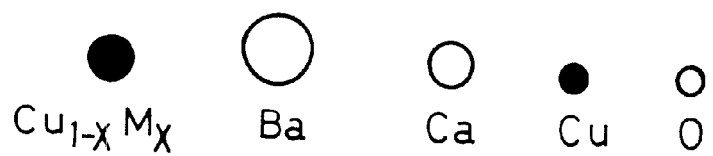

FIG. 1 is a diagram showing an example of a model of a crystal unit cell of a high temperature superconductor having low superconducting anisotropy according to this invention. With reference to the drawing, a unit cell 1 comprises a pair of superconducting layer 2 and charge reservoir layer 3 provided along the c-axis. The superconducting layer 2 has five $CuO_2$ layers 4. These unit cells, each measuring about 3.85 by 3.85 by 18.0 Å, are bonded together so that the layers 2 and 3 are alternated to constitute a high-temperature superconductor in single-crystal, film, or bulk form, depending on what the superconductor will be used for. In accordance with this invention, by increasing the thickness of the superconducting layer 2 having a layered structure, the superconducting electron uncertainty region (thickness) in the c-axis direction is expanded according to the uncertainty principle, making it possible, in terms of crystal structure, to increase the coherence length $\xi c$ in the c-axis direction, allowing the superconducting anisotropy $\gamma$ to be reduced to a very low level.

Moreover, some or all of the atoms constituting the charge reservoir layer are replaced with atoms giving superconductivity to metallize or render the charge reservoir layer superconducting. However, based on another conclusion derived from the uncertainty principle, since the superconduction coherence length is proportional to the Fermi velocity $V_F$, metallizing the charge reservoir layer or rendering it superconducting enlarges the $V_F$ component in the c-axis direction, which, in terms of the electron structure, increases the coherence length $\xi c$, thus enabling the superconducting anisotropy to be reduced.

A copper oxide represented by the formula $Cu_{1-x}M_x$ $(Ba_{1-y}Sr_y)_2(Ca_{1-z}L_z)_{n-1}Cu_nO_{2n+4-w}$ (in which M is one or more selected from the group consisting of Ti, Hg, Bi, Pb, Au, In, Sn, Ag, Mo, Re, Os, Cr, V, Fe, and lanthanide elements, L is one or more selected from the group consisting of Li, Na, Y, and lanthanide elements, $0 \leq x < 1$, $0 \leq y \leq 1$, $0 \leq z \leq 1$, $0 \leq w \leq 4$, and $3 \leq n \leq 16$) can be cited as an example of a preferred composition for the superconductor of this invention.

In the case of this copper oxide superconductor, the coupling between the charge reservoir layer and the superconducting layer of the superconductor is strengthened by increasing the number n of $(Ca_{1-z}L_z)_{n-1}Cu_nO_{2n}$ layers, metallizing the charge reservoir layer $(Cu_{1-x}M_x)(Ba_{1-y}Sr_y)_2$ $O_{4-w}$ bonded to the superconductor layer, and also by the original, intrinsic superconductivity of the charge reservoir layer. As a result, the superconducting electron uncertainty region (thickness) in the c-axis direction is enlarged according to the uncertainty principle, increasing the coherence length $\xi c$ and decreasing superconducting anisotropy.

In the case of some copper oxide superconductors, the coherence length $\xi c$ can be empirically expressed as $\xi c = 0.32$ (n-1) nm, $\xi ab = 1.6$ nm, giving superconducting anisotropy $\gamma = \xi ab/\xi c = 5/(n-1)$, so in the case of superconductors in which n is three or more, if the carrier concentration is sufficient a superconducting anisotropy of $\gamma < 4$ can be realized.

Furthermore, with respect to the above copper oxide superconductors, the average valence number of the copper can be expressed as $Z = 2 + (4-2 w)/(n+1) < 2 + 4/(n+1)$, and from n=1 to 16, Z will be not less than 2.25, so that decreasing the oxygen vacancy concentration w enables a sufficient carrier supply to realize a superconducting anisotropy of $\gamma < 4$.

Moreover, this invention can be applied not only to copper oxide superconductors, but is universally applicable to other superconductors having a layered structure. For example, a superconductor can be used having a composition expressed as $Cu_{1-x}M_x(Ba_{1-y-m}Sr_yR_m)_2$ (in which $0 \leq m \leq 1$, and $0 \leq y+m \leq 1$) formed by partially replacing the Ba in the $Cu_{1-x}M_x$ $(Ba_{1-y}Sr_y)_2O_{4-w}$ charge reservoir layer of the above copper oxide superconductor by a lanthanide element.

The above-described low superconducting anisotropy, high-temperature superconductor may be prepared by a known non-equilibrium method such as high-pressure synthesis, hot pressing, HIP (high-temperature isostatic processing), sputtering or laser ablation. The sputtering target may be a sintered material having the same composition as the superconductor to be produced, or a target may be formed of each of the elements to be laminated in atomic layers. Sputtering or laser ablation is performed using, for example, a single-crystal substrate of $SrTiO_3$, $NdGaO_3$, $LaAlO_3$, YSZ (Y stabilized $ZrO_2$), or $LaSrCaO_4$ or the like at a substrate temperature of 300 to 800° C. and an oxygen pressure of 0.01 to 1 Torr. An ideal number of $CuO_2$ layers is four to six, determined by controlling the composition ratios of the starting materials, reaction temperature, reaction time and other such conditions.

The low superconducting anisotropy, high-temperature superconductor according to the present invention is characterized by a structure comprised by depositing or applying the above superconductor starting materials on the above-described single-crystal substrate or crystal-oriented film substrate which were then sealed together with a reaction promoting agent for Tl etc. and a structure stabilizing agent in a gold, silver, Inconel, Hastelloy, alumina, AlN, BN or other such oxidation resistant metal or ceramics capsule and heated at 600 to 1100° C. for 0.01 to 10 hours, to thus obtain a single-crystal or crystal-oriented film aligned at least along the a-axis and c-axis with a high critical current density Jc. The superconductor starting material may also be supplied onto the single-crystal substrate or crystal-oriented film substrate, which is then sealed in an oxidation resistant capsule and heated at 600 to 1100° C. under a pressure of 1 to 10 atmospheres to synthesize bulk or single-crystal superconducting materials having a high critical current density Jc aligned along at least the a-axis and c-axis.

Also, a low superconducting anisotropy, high-temperature superconductor with a high critical current density Jc with grains aligned at least along the a-axis and c-axis may be obtained by supplying amorphous superconductor material in place of the starting material to the substrate, which is then sealed in an oxidation resistant capsule and pressed and heated as described above.

In accordance with this invention, a high-temperature superconductor can be obtained having a hitherto unachievable superconducting anisotropy $\gamma$ of 4 or less, or even a quasi-isotropic low superconducting anisotropy of close to 1, thereby making it possible to develop a wire, bulk or device by using a high-temperature superconducting material having a long coherence length of $\xi c=1$ nm, making it an ideal material for fabricating multilayer-junction-type Josephson devices, having a high Jc and intrafacial isotropy.

Moreover, while the accepted wisdom has formerly been that a high Tc is closely related to high superconducting anisotropy (two-dimensionality), this accepted wisdom is overthrown by this invention, in accordance with which a high-temperature superconductor can be obtained having a superconducting anisotropy that is so low as to be close to isotropy. As such, the scientific impact of the invention is major, and it also provides an important indicator with respect to elucidating the mechanism of high temperature superconductivity.

The following examples describe preferred embodiments of this invention. However, the examples are not to be taken as limiting the invention.

EXAMPLE 1

Samples of $Cu_{1-x}Tl_xBa_2Ca_3Cu_4O_{12-w}$ ($Cu_{1-x}Tl_x$-1234), which among $Cu_{1-x}Tl_xBa_2Ca_{n-1}Cu_nO_{2n+4-w}$, has the highest Tc, were prepared, using as the starting material a mixture of the precursor of $Ba_2Ca_3Cu_4O_9$, CuO and $Tl_2O_3$ adjusted to produce six mixtures with an x of, respectively, 0, 0.25, 0.4, 0.5, 0.6, and 0.75. To control the oxygen concentration, $Cu_2O$ was used as a reducing agent and AgO as an oxidizer. The samples were prepared by heating the mixtures for 1 to 3 hours at 900 to 1100° C. under a pressure of 3 GPa.

Figure 2A:
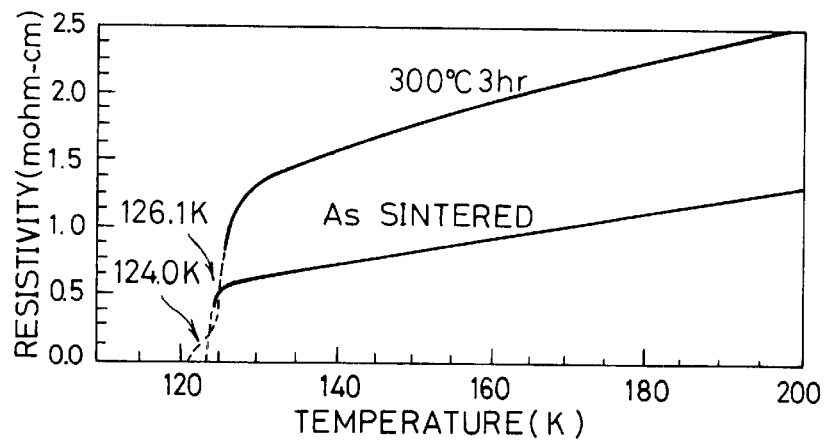
FIG. 2(a) is a graph showing the temperature dependence of the electrical resistivity of a Cu$_{1-x}$Tl$_x$-1234 sample in which x is 0.4.
Figure 2B:
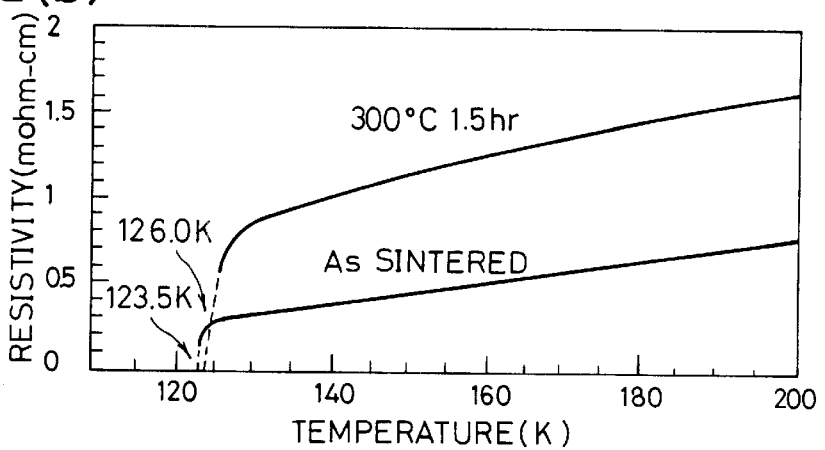
FIG. 2(b) is a graph showing the temperature dependence of the electrical resistivity of a Cu$_{1-x}$Tl$_x$-1234 sample in which x is 0.5.
Figure 2C:
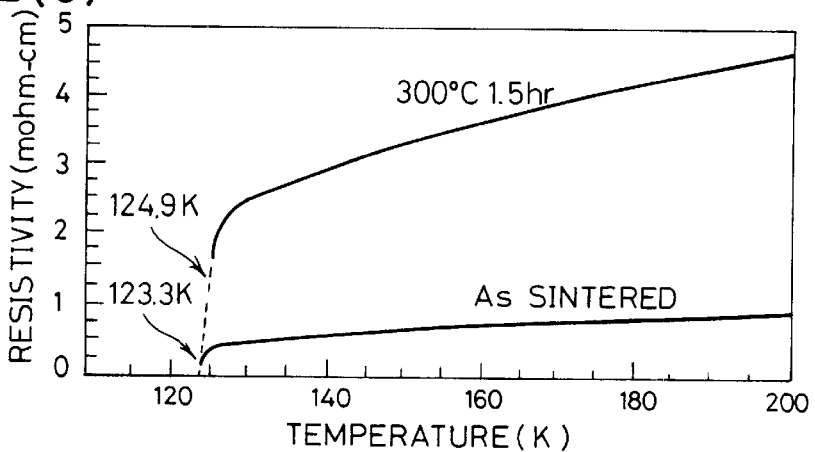
FIG. 2(c) is a graph showing the temperature dependence of the electrical resistivity of a Cu$_{1-x}$Tl$_x$-1234 sample in which x is 0.6.

FIG. 2 shows the relationship between temperature and the electrical resistivity of the samples, with respect to samples in which x is 0.4 in the case of FIG. 2(a), 0.5 in the case of FIG. 2(b), and 0.6 in the case of FIG. 2(c). In the as-sintered state the high oxygen concentration (high carrier concentration) samples exhibited a Tc of 123 K (FIGS. 2(a), 2(b), 2(c)), with annealed samples having an optimum carrier concentration showing the highest Tc of 126 K (FIG. 2(a)).

Figure 3:
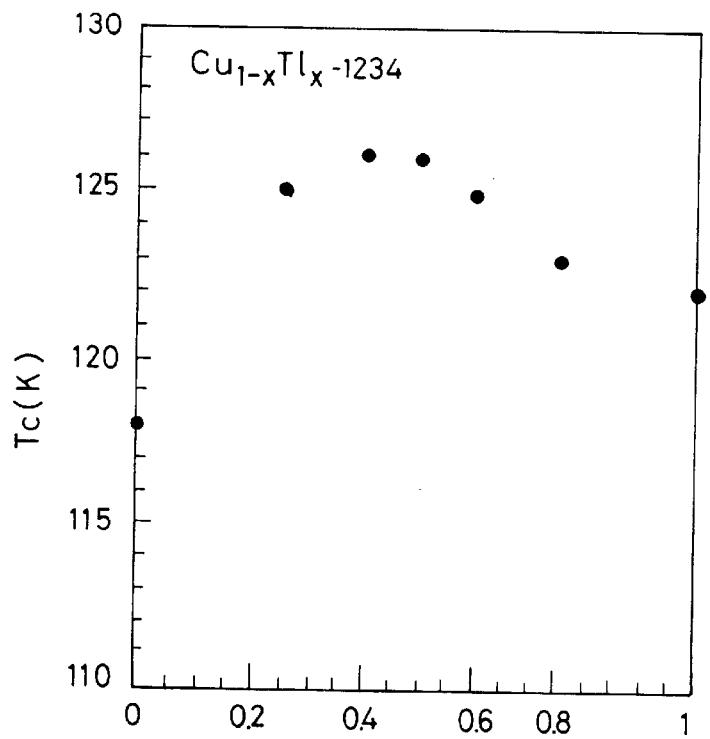
FIG. 3 is a diagram showing superconducting transition temperature plotted against Tl concentration x of a $Cu_{1-x}Tl_x$-1234 sample.
Figure 4:
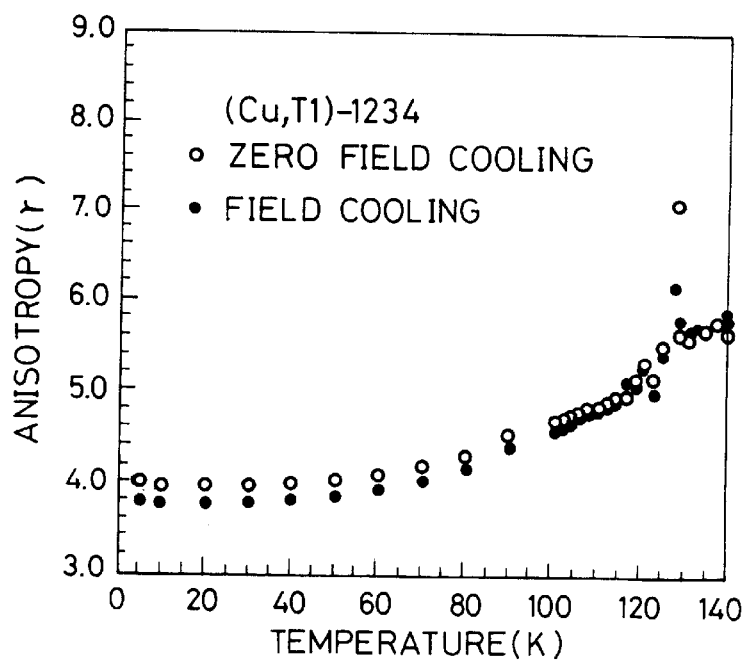
FIG. 4 shows the relationship between temperature and superconducting anisotropy ($\gamma=\chi c/\chi b$) obtained from the magnetic susceptibility ratio of a $Cu_{1-x}Tl_x$-1234 sample.

As shown in FIG. 3, all samples, in which x was in the range $0 \leq x \leq 1$, had a Tc ranging from 118 K to 126 K. Also, as shown in FIG. 4, samples in which x was 0.4 could be given a superconducting anisotropy of $\gamma \leq 4$ at 20 to 40 K. The superconducting anisotropy values shown here were obtained based on samples doped with an optimum amount of carrier for raising the Tc. Superconductors having an even lower superconducting anisotropy can be obtained by increasing the carrier concentration.

EXAMPLE 2

The $Cu_{1-x}Tl_x$-1234 of Example 1 and $Cu_{1-x}Tl_xBa_2Ca_2Cu_3O_{10-w}$ ($Cu_{1-x}Tl_x$-1223) were prepared using a high-productivity low-pressure (up to 1 GPa) hot press process. Oxygen concentration was regulated using $Cu_2O$ as a reducing agent and AgO as an oxidizer. By using an x of 0.25, 0.4, 0.5, 0.6 and 0.75, sintered samples having a Tc ranging from 110 K to 125 K were obtained. The sintered superconductors thus obtained can be expected to exhibit the same superconducting anisotropy of $\gamma \leq 4$ as that obtained using the high-pressure synthesizing process of Example 1.

EXAMPLE 3

Figure 5A:
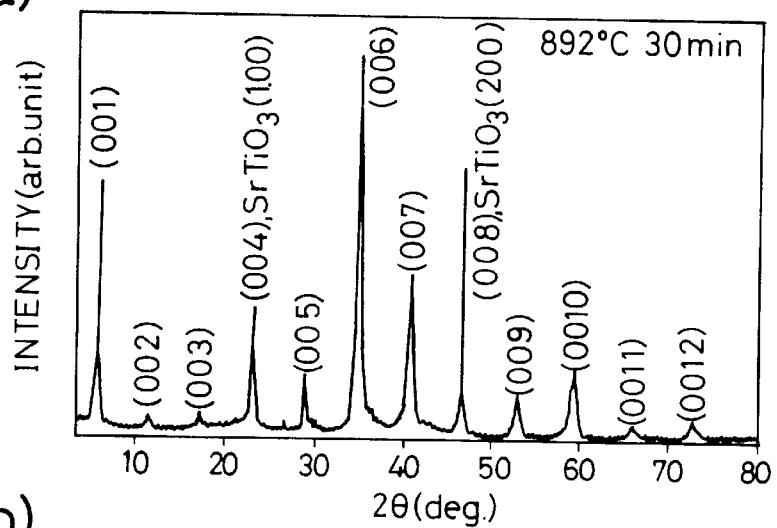
FIG. 5(a) is an x-ray diffraction pattern showing the high (00l) orientation of a $Cu_{1-x}Tl_x$-1223 thin film.
Figure 5B:
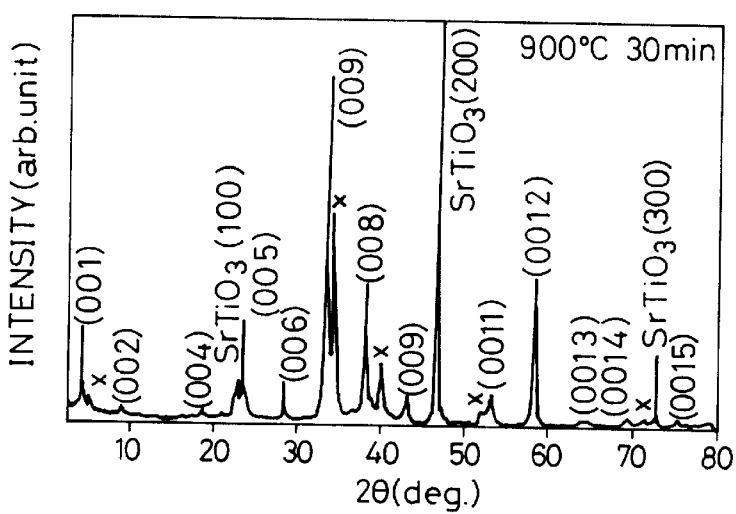
FIG. 5(b) is an x-ray diffraction pattern showing the high (00l) orientation of a $Cu_{1-x}Tl_x$-1234 thin film.
Figure 5C:
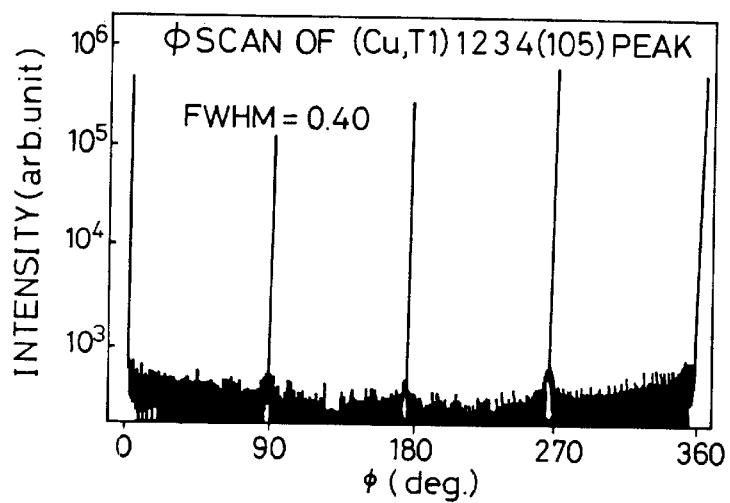
FIG. 5(c) is an x-ray diffraction pattern showing the high ab-axis orientation of a $Cu_{1-x}Tl_x$-1234 thin film.
Figure 6A:
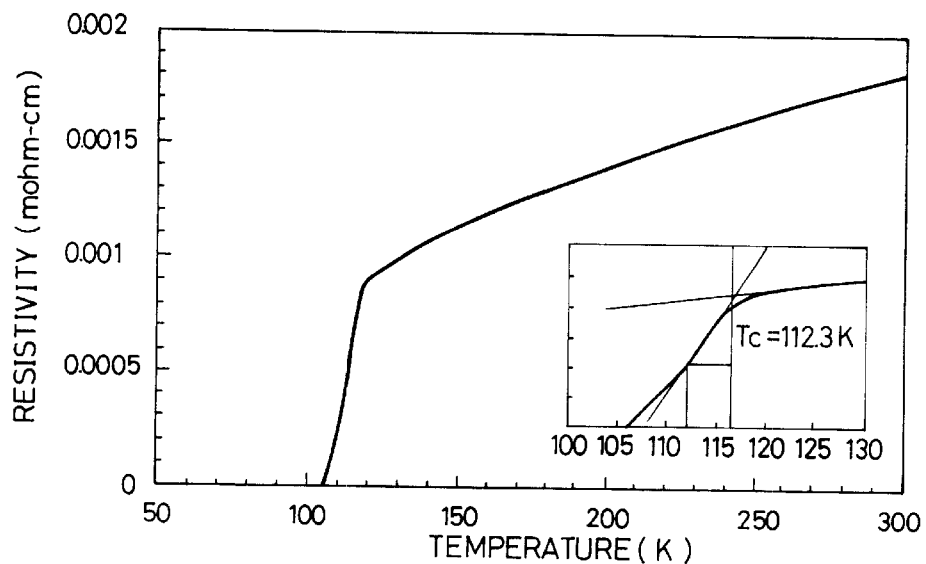
FIG. 6(a) is a diagram showing the temperature dependence of the electrical resistivity of a $Cu_{1-x}Tl_x$-1223 thin film with Tc=112 K.
Figure 6B:
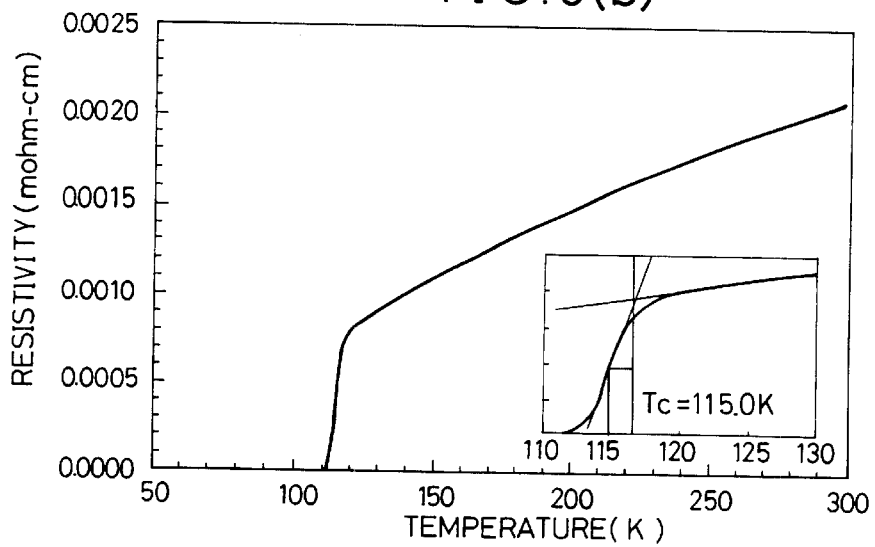
FIG. 6(b) is a diagram showing the temperature dependence of the electrical resistivity of a $Cu_{1-x}Tl_x$-1234 thin film with Tc=115 K.

A $Ba_2Ca_2Cu_4O_6$ or $Ba_2Ca_2Cu_5O_{10}$ target was used to form an amorphous film on a substrate of $SrTiO_3$, $NdGaO_3$, $LaAlO_3$, YSZ (Y stabilized $ZrO_2$) or $LaSrGaO_4$. The amorphous film, together with a pellet of $Tl_x$-1223 or $Tl_x$-1234 (x=0.1 to 2) was then inserted into a sealed capsule of Au, Ag, Inconel, Hastelloy, alumina, AlN, BN or the like and heated at 700 to 920° C. for 0.5 minutes to 10 hours to produce thin films of $Cu_{1-x}Tl_x$-1234 and $Cu_{1-x}Tl_x$-1223. From FIG. 5, it can be seen that these thin films showed good properties with respect to both the c-axis aligned and ab-axis aligned samples. As shown by FIG. 6, the $Cu_{1-x}Tl_x$-1223 and $Cu_{1-x}Tl_x$-1234 thin films showed a Tc of 112 K and 115 K, respectively. As in the case of bulk superconductor, a superconducting anisotropy of $\gamma<4$ can be expected from the thin films.

EXAMPLE 4

With respect to $(Cu_{1-x}Tl_x)(Ba_{1-y}Sr_y)_2Ca_{n-1}Cu_nO_{2n+4-w}$, samples were prepared by means of the same synthesis process as in Example 1, using as the starting material a mixture of the precursor of $(Ba_{1-y}Sr_y)_2Ca_2Cu_3O_7$ or $(Ba_{1-y}Sr_y)_2Ca_3Cu_4O_9$ with appropriate amounts of $Tl_2O_3$ and CuO or $Cu_2O$ (with AgO as an oxidizer when there was little $Tl_2O_3$) to produce $(Cu_{1-x}Tl_x)$-1223 and $(Cu_{1-x}Tl_x)$-1234 in which x was 0.25 to 0.75 and y was 0.25, 0.5 or 0.75.

EXAMPLE 5

With respect to $(Cu_{1-x}Tl_x)Ba_2(Ca_{1-z}Li_z)_{n-1}Cu_nO_{2n+4-w}$, samples were prepared using as the starting material a mixture of the precursor of $Ba_2(Ca_{1-z}Li_z)_2Cu_3O_7$ or $Ba_2(Ca_{1-z}Li_z)_3Cu_4O_7$ and $Tl_2O_3$ and CuO or $Cu_2O$, adding AgO as an oxidizer when there was little $Tl_2O_3$. The addition of the Li slightly decreased the Tc, but a Tc of at least 100 K could be obtained. As in the replacement of Cu by Tl, the replacement of Li by Ca sites promoted the reaction, was effective for lowering the reaction temperature, and served to decrease the Tl concentration.

EXAMPLE 6

With respect to $(Cu_{1-x}Hg_x)Ba_2Ca_{n-1}Cu_nO_{2n+4-w}$, samples were prepared using high-pressure synthesis of $Cu_{1-x}Hg_x$-1223, 1234, and 1245 compositions with an x of 0.25, 0.5, and 0.75, resulting in a $Cu_{0.5}Hg_{0.5}$-1223 superconductor exhibiting a Tc of 120 K and $\gamma$ of 4.0. It should be possible to further improve the Tc and decrease the superconducting anisotropy by optimizing the carrier concentration.

EXAMPLE 7

With respect to $(Cu_{1-x}M_x)Ba_2Ca_{n-1}Cu_nO_{2n+4-w}$ in which the M was Ag, Au, Bi, Pb, In, Sn, B, C, N, S, V, Cr, Mo, Re, Os, or Fe, a composition was obtained that, with respect to n=3 and 4, was substantially single phase in the x<0.25 region. The Tc was lower in the case of a value of x>0. Therefore these replacement elements are effective for forming magnetic flux pinning centers, and as such are of practical importance.

EXAMPLE 8

$Cu_{1-x}M_x(Ba_{1-y-m}Sr_yR_m)_2(Ca_{1-z}L_z)_{n-1}Cu_nO_{2n+4-w}$ in which M was Tl, R was La, Pr, Ce, or Nd, y=0 and m<0.25 exhibited a lower Tc than samples in which m=0. These replacement elements are effective in forming magnetic flux pinning centers.

EXAMPLE 9

Figure 7:
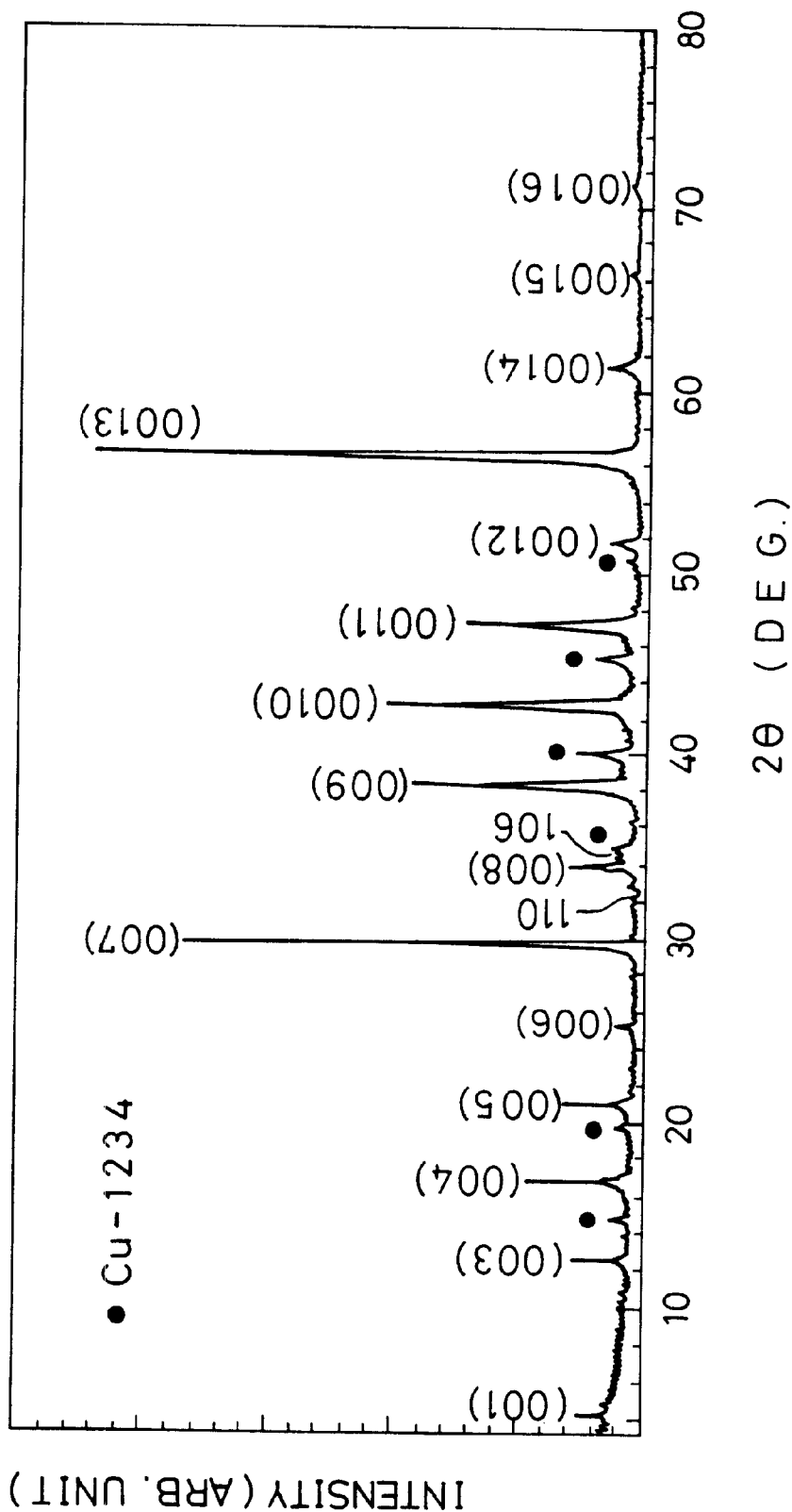
FIG. 7 is an x-ray diffraction pattern of a Cu-1245 powder sample that has been given a c-axis orientation.

Samples were prepared having five $CuO_2$ layers of $CuBa_2Ca_4Cu_5O_{14-y}$(Cu-1245) produced by mixing the precursor of $Ba_2Ca_3Cu_5O_y$ or $Ba_2Ca_4Cu_5O_y$ with an appropriate amount of AgO and heating the preparations at 1100 to 1150° C. for 1 to 5 hours under a pressure of 3 to 4.5 GPa. As shown by FIG. 7, the main component of the samples thus obtained was Cu-1245 phase. The Tc was 115 K, and the superconducting anisotropy, as measured from the magnetic susceptibility ratio, was γ=1.9, as shown in FIG. 8. This was higher than the estimated value of 1.3, but it should be possible to further reduce the superconducting anisotropy by increasing the oxygen concentration and carrier concentration.

What is claimed is:

1. A high-temperature superconductor having predetermined superconducting anisotropy comprising a two-dimensional layered structure of crystal unit cells each of said unit cells constituted by a pair of superconducting layer and charge reservoir layer provided perpendicularly on the superconducting layer, wherein at least a portion of atoms comprising the charge reservoir layer is replaced by atoms giving superconductivity, thereby metallizing or rendering the charge reservoir layer superconducting, and the superconducting layer comprises 3 to 16 layers and has a coherence length of 0.64 to 4.80 nm in a thickness direction, based on the uncertainty principle and has a superconducting transition temperature of 118 to 126K, thereby lowering superconducting anisotropy to the range of from less than 4 to close to 1.

2. The superconductor according to claim 1, wherein M in the formula is Tl. superconductor having a composition expressed by a formula $Cu_{1-x}M_x(Ba_{1-y}Sr_y)_2(Ca_{1-z}L_z)_{n-1}Cu_nO_{2n+4-w}$, in which M is at least one selected from the group consisting of Tl, Hg, Bi, Pb, Au, In, Sn, Ag, Mo, Re, Os, Cr, V, Fe and lanthanide elements, L is at least one selected from the group consisting of Li, Na, Y and lanthanide elements, $0 \leq x \leq 1$, $0 \leq y \leq 1$, $0 \leq z \leq 1$, $0 \leq w \leq 4$, and $3 \leq n \leq 16$).

3. A method for producing a high-temperature superconductor having predetermined superconducting anisotropy constituted by a single-crystal or crystal-oriented film aligned at least along a-axis and c-axis, with a predetermined critical current density Jc, comprising supplying the superconductor composition of claim 1 unto a substrate, sealing the substrate in an oxidation resistant capsule and heating it in a sealed state at 600 to 1100° C. for 0.01 to 10 hours.

4. A method for producing a high-temperature superconductor having predetermined superconducting anisotropy constituted by a single-crystal or bulk superconductor aligned with at least a-axis and c-axis, with a predetermined critical current density Jc, comprising supplying the superconductor composition of claim 1 unto a substrate, sealing the substrate in an oxidation resistant capsule and subjecting it to a pressure of at least one atmosphere.

* * * * *

UNITED STATES PATENT AND TRADEMARK OFFICE
CERTIFICATE OF CORRECTION

PATENT NO. : 6,444,620 B2  
DATED : September 3, 2002  
INVENTOR(S) : Ihara

It is certified that error appears in the above-identified patent and that said Letters Patent is hereby corrected as shown below:

<u>Title page,</u>
The CPA information has been omitted. Item [45] and the Notice information should read as follows:

-- **[45] Date of Patent: * Sep. 3, 2002**
   [*]   Notice:      This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days. --

Signed and Sealed this

Twenty-fourth Day of June, 2003

JAMES E. ROGAN  
*Director of the United States Patent and Trademark Office*